United States Patent [19]

Delgado et al.

[11] Patent Number: 4,669,416
[45] Date of Patent: Jun. 2, 1987

[54] COMPOSITE CARRIER PLATE

[75] Inventors: Robert F. Delgado, Culver City; Kenneth H. Magrini, Carlsbad, both of Calif.

[73] Assignee: Metoramic Sciences, Inc., Carlsbad, Calif.

[21] Appl. No.: 878,305

[22] Filed: Jun. 25, 1986

[51] Int. Cl.⁴ .................. B05C 13/00; B05C 13/02
[52] U.S. Cl. ............................ 118/503; 118/500; 118/504; 269/900; 269/903; 428/137
[58] Field of Search ............ 118/503, 504, 500; 211/60.1, 26; 269/900, 903, 287; 248/309.1, 546; 428/137, 156, 217, 901

[56] References Cited

U.S. PATENT DOCUMENTS

| | | |
|---|---|---|
| 1,869,717 | 2/1930 | Silver . |
| 2,032,935 | 3/1936 | Hurt ............................ 428/156 |
| 2,518,450 | 8/1950 | Cowen et al. .................. 206/65 |
| 3,028,949 | 4/1962 | Sohosky ...................... 206/0.83 |
| 3,082,115 | 3/1963 | Griffin et al. ................. 117/38 |
| 3,178,014 | 4/1965 | Goldwasser ................. 206/0.83 |
| 3,453,989 | 7/1969 | Bippus ......................... 118/503 |
| 4,381,321 | 4/1983 | Braden ........................... 427/79 |
| 4,393,808 | 7/1983 | Braden ......................... 118/503 |
| 4,526,129 | 7/1985 | Braden ......................... 118/503 |

Primary Examiner—Sam Silverberg
Assistant Examiner—Terry J. Owens
Attorney, Agent, or Firm—Loyal M. Hanson

[57] ABSTRACT

A device for handling miniature electronic components is disclosed that employs a central member of unitary construction and compliant composition having a pair of generally parallel first and second surfaces. An apertured portion of the central member defines an array of receptor holes extending through the central member between the first and second surfaces, each one of the receptor holes having a cross sectional area that is shaped and dimensioned to receive in a force fit one of a batch of electronic components to be handled. Framing components for facilitating central member handling and enabling central member replacement without obstructing component access to the receptor holes define a generally rigid removable framework.

10 Claims, 17 Drawing Figures

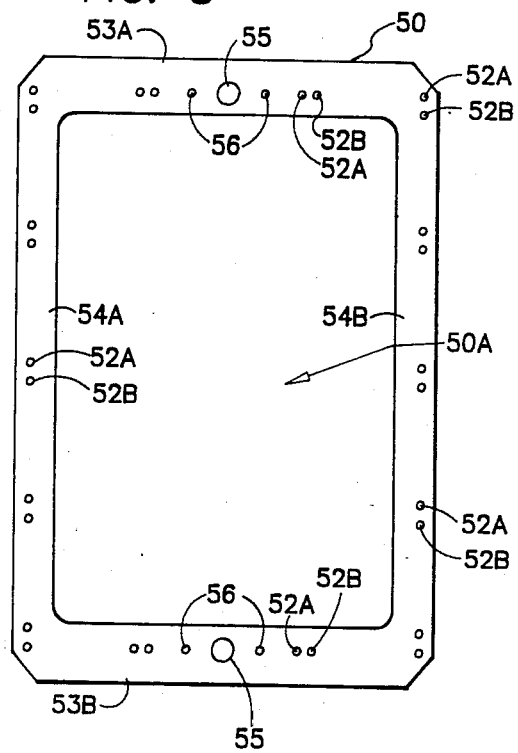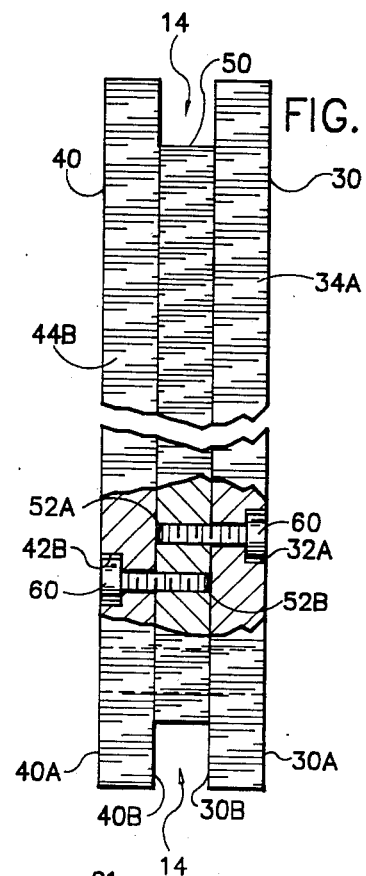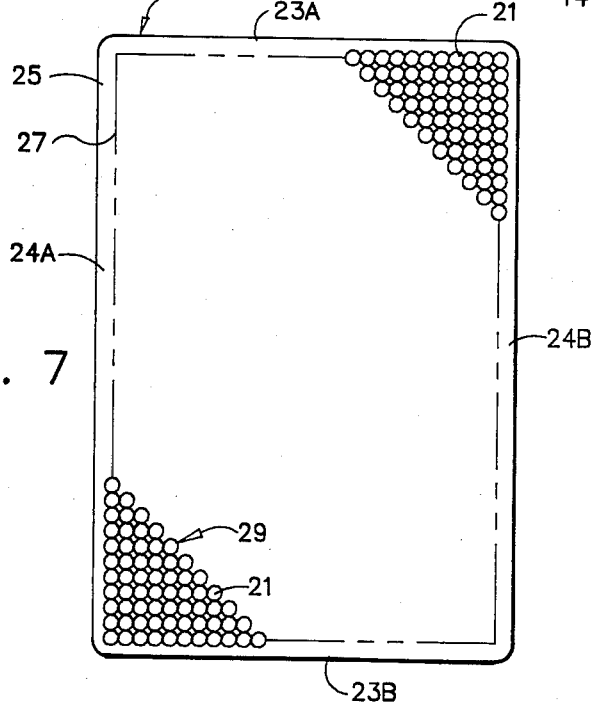

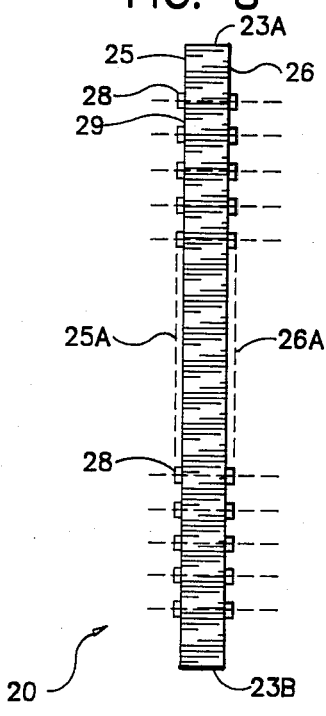
FIG. 8
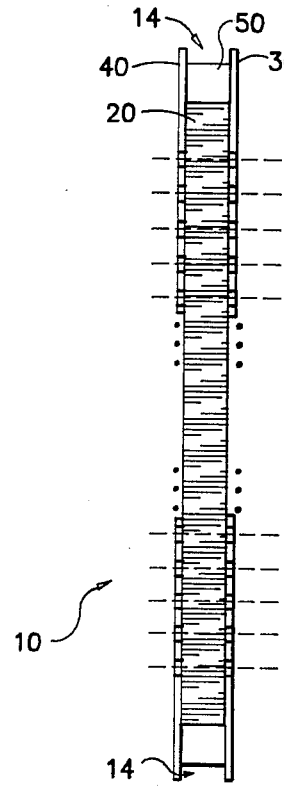
FIG. 10
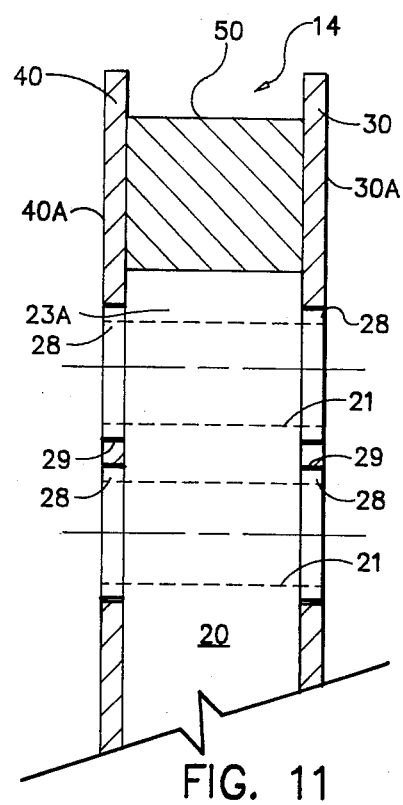
FIG. 9
FIG. 11

COMPOSITE CARRIER PLATE

BACKGROUND OF THE INVENTION

1. Technical Field. This invention relates generally to the processing of miniature electronic components such as ceramic chip capacitors and resistors, and particularly to a device useful in handling these components during the process of applying a conductive coating to the component ends.

2. BACKGROUND INFORMATION. The tiny size of many chip capacitors and resistors complicates batch processing. Fabricated in right rectangular shapes having dimensions on the order of 0.140"×0.120"×0.040", these difficult to handle components require appropriate equipment and precision handling techniques if processing is to be performed economically. End coating the component is of particular concern.

End coating prepares the component ends so that they can be soldered for electrical connection in a circuit. Typically accomplished by dipping the component ends in an electrically conductive coating material, end coating results in a quantity of the conductive material adhering to the component end as an electrical connection to the element within. But the small component size greatly complicates this process without proper equipment.

U.S. Pat. Nos. 4,381,321, 4,393,808, and 4,526,129 describe systems that may be used for this purpose, and they are incorporated herein by reference for the details of the existing end-coating equipment and techniques they described.

According to these patents, vacuum assisted vibration equipment loads a component into each one of a regular array of openings in a rectangular loading plate. A bank of pins in a press then transfers the components from the loading plate to corresponding holes in a part handling or carrier plate. The carrier plate holes are slightly undersized to frictionally retain the components, and with the component ends protruding slightly from these holes, the carrier plate is passed by a coating mechanism which transfers conductive material to the component ends.

Thus, lining up the components in a carrier plate enables end coating in significant batches despite the many complications attending tiny component size. But effective as they are, existing carrier plates suffer from certain drawbacks.

Existing carrier plates are typically fabricated from a rectangular aluminum plate having a size on the order of 7" by 11" by 11/32" thick. A regular array of holes is predrilled in the plate, a pattern of 51 holes by 83 holes for a total of 4,233 holes being typical. The hole size, and consequently the array size, may differ according to the size of the components to be handled.

Once the holes have been formed, the plate is coated with a compliant material that fills the holes. An elastomer coating such as silicon rubber resin is often employed for this purpose.

After the compliant material cures, a new set of smaller holes, on the order of 0.046" to 0.110" in diameter (depending on component size) is drilled in line with the original holes, so that a coated plate with an array of lined holes results. These resulting holes, or receptor holes, are slightly smaller than the components to be handled, so that the components can be gently forced into the receptor holes and retained in place for end coating.

Thus, existing carrier plates involve a multi-step fabrication process that is time consuming and correspondingly expensive to accomplish. In addition, special procedures must be employed to apply the compliant material to the plate, followed by a second precise drilling operation to complete the receptor holes. Consequently, it is desirable to have a new and improved carrier plate design that is more convenient and less expensive to fabricate.

Once fabricated, existing carrier plates experience abrasive wear and temperature degradation during use. This is aggravated by the large expanse of compliant material covering the surface of the plate where it is exposed to damage. Consequently, it is desirable to have a carrier plate that has less compliant material exposed, to thereby inhibit wear and degradation.

When abrasive wear and temperature degradation reaches a point necessitating repair or replacement, existing carrier plates exhibit further drawbacks. Though less expensive to repair than replace, repair requires dissolving and scrapping and otherwise removing the compliant material from the aluminum plate. Then fresh material must be applied, cured, and redrilled. This is time consuming and expensive to accomplish, and the damaged carrier plate must be taken out of service and shipped to repair facilities having the means for performing these operations. Consequently it is desirable to have a carrier plate that can be quickly and easily repaired--one enabling replacement of the compliant material by a user with a few simple operations.

Thus, it is desirable to have a new and improved carrier plate that alleviates the above mentioned concerns, while being compatible with other existing component handling equipment.

SUMMARY OF THE INVENTION

Therefore, the principal object of the present invention is to provide a new and improved carrier plate for use in handling miniature components.

It is an object to provide such a carrier plate adapted to more convenient, less expensive fabrication.

It is a further object to provide such a carrier plate enabling quick and easy replacement of damaged compliant material by the user, with a few simple operations.

And it is yet another object to provide such a carrier plate that is compatible with other commonly available component handling equipment.

Briefly, the above and further objects are realized by a new and improved composite carrier plate constructed with a replaceable element.

The composite carrier plate employs a central member of unitary construction and compliant composition having a pair of generally parallel first and second surfaces. An apertured portion of the central member defines an array of receptor holes extending through the central member between the first and second surfaces, each one of the receptor holes having a cross sectional area that is shaped and dimensioned to receive in a force fit one of a batch of electronic components to be handled.

Framing components for facilitating central member handling and enabling central member replacement without obstructing component access to the receptor holes define a generally rigid removable framework.

Thus, a composite construction is achieved that alleviates many drawbacks associated with existing carrier plates. The composite carrier plate is adapted to more convenient, less expensive fabrication. In this regard, the compliant central member, or flexible elastomer membrane (FEM) can be fabricated by suitable techniques such as injection molding, without the need for precision drilling and at dramatically reduced cost.

In addition, the composite carrier plate enables quick and easy replacement of the FEM element with a few simple user operations. Instead of shipping the carrier plate to another for repair, the user disassembles it, inserts a new FEM element, and reassembles the carrier plate for immediate use.

Furthermore, the composite carrier plate is fully compatible with other commonly used component handling equipment, such as that described in the above reference patents, and the framework can be shaped and dimensioned to other user specifications.

BRIEF DESCRIPTION OF THE DRAWINGS

The above-mentioned and other objects and features of this invention and the manner of attaining them will become apparent, and the invention itself will be best understood, by reference to the following description of an embodiment of the invention taken in conjunction with the accompanying drawings.

FIG. 5 is a top plan view of the spacer member employed in the carrier plate;

FIG. 6 is an enlarged side view of a portion of the assembled carrier plate, with a broken out portion illustrating screw hole alignment;

FIG. 7 is a top plan view of the compliant central member employed in the carrier plate;

FIG. 8 is a side view of the central member;

FIG. 9 is an enlarged detail of a portion of the central member illustrated in FIG. 8;

FIG. 10 is a side view of the central member assembled between the support plates; and FIG. 11 is an enlarged detail of a portion of the assembled carrier plate illustrated in FIG. 9, showing the relation of the central member to the support plates.

DESCRIPTION OF THE PREFERRED EMBODIMENTS

Figure 1:
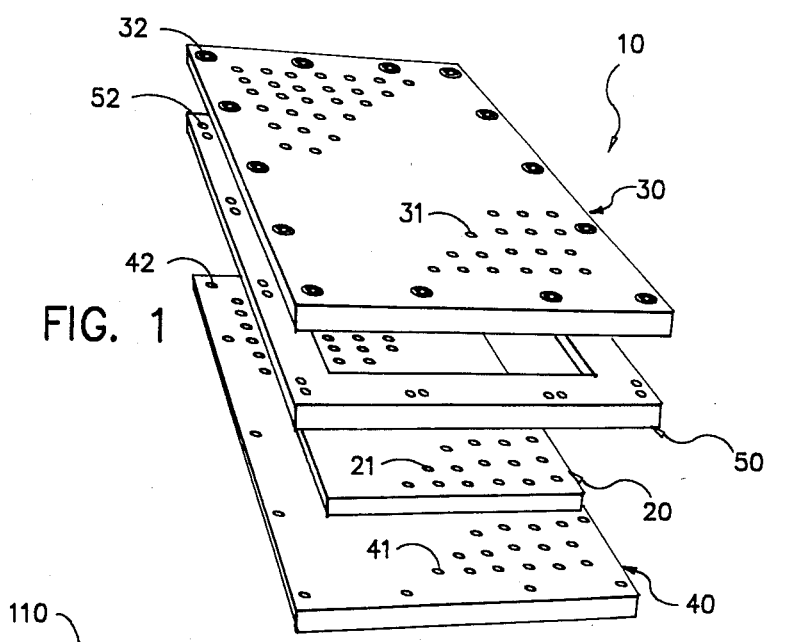
FIG. 1 of the drawings is a pictorial assembly view of a carrier plate constructed according to the invention.

Referring now to the drawings, and more particularly to FIG. 1, there is shown a composite carrier plate 10 constructed in accordance with the present invention. Illustrated unassembled in FIG. 1 for convenience in identifying the component parts, the carrier plate 10 includes a compliant central member, or element 20, contained within a generally rigid framework comprising a first plate member or support plate 30, a second plate member or support plate 40, and a spacing member, spacer 50.

When the carrier plate 10 is fully assembled, the spacer 50 is disposed around the periphery of the element 20, with both the spacer 50 and element 20 being sandwiched between support plates 30 and 40. The two support plates attach to the spacer 50 to complete this assembly, and spacer 50 is shaped and dimensioned so that element 20 is retained loosely within.

Assembled in this manner, receptor holes 21 in element 20 align with corresponding plate holes 31 in support plate 30 and plate holes 41 in support plate 40, to enable component access to the receptor holes. And disassembly simply involves detaching the support plates from the spacer, to remove the element within.

Thus, the composite carrier plate of this invention enables quick and convenient assembly and disassembly, to reduce fabrication costs and enable field replacement of the element 20. When the element becomes damaged, replacement can be accomplished by a relatively unskilled person without special tools and equipment. In addition, the element 20 is adapted to fabrication by known injection molding techniques at greatly reduced cost, so that extra elements can be kept in supply for replacement purposes.

As will be subsequently described in connection with the other figures, the element 20 includes recessed portions around each of the receptor holes. Not depicted in FIG. 1 for illustrative convenience, the recessed portions define upright cylindrical sleeves around each receptor hole that extend into the plate holes toward the outer surface of the support plates. This enables a component extending slightly out of a receptor hole to also extend slightly beyond the outer surface of the support plate where it is accessible for end coating, other other processing, and this achieves important functional aspects of prior art carrier plates in a far superior design.

Support plates 30 and 40 are similar in details of construction, and they are attached to the spacer 50 by suitable means, such as machine screws (not shown). The support plates each define a common array of screw holes disposed along the support plate margins, as designated at 32 and 42. Each of these screw holes mates with a corresponding one of tapped screw holes 52 disposed around the margins of the spacer 50, so that the carrier plate can be conveniently disassembled and the compliant element replaced.

Figure 2:
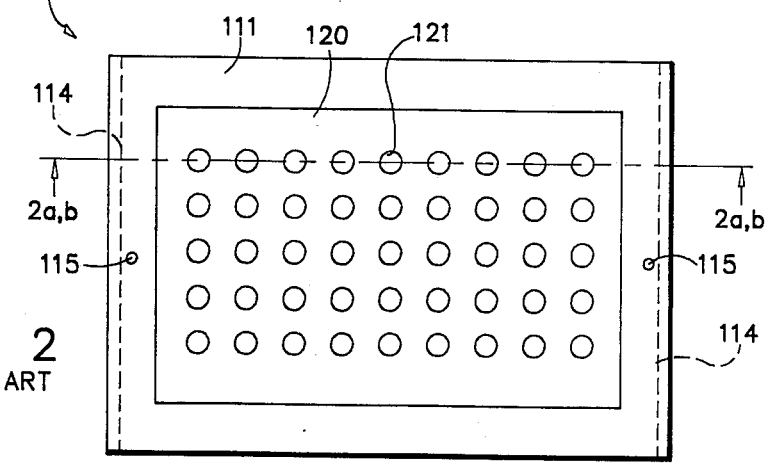
FIG. 2 is a schematic representation of a carrier plate constructed according to the prior art.
Figure 2A:
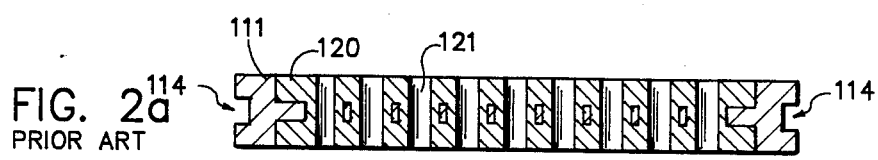
FIG. 2a is a cross sectional view of the prior art carrier plate of FIG. 2.
Figure 2B:
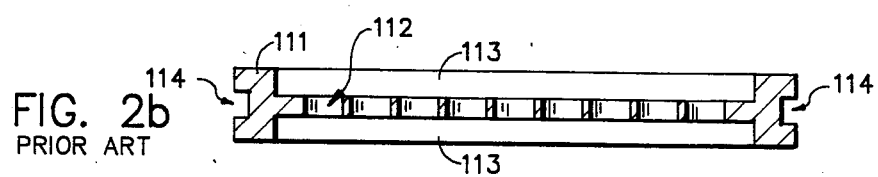
FIG. 2b is a cross sectional view of the prior art carrier plate, with the compliant material omitted.
Figure 3:
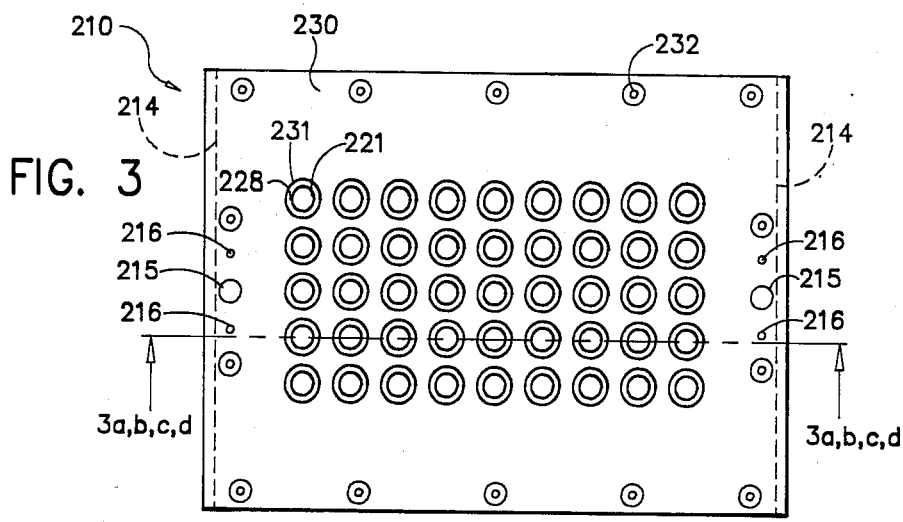
FIGS. 3 and 3a–3d are schematic representations of a carrier plate constructed according to the invention showing component placement relative to the prior art carrier plate of FIGS. 2, 2a, and 2b.
Figure 3A:
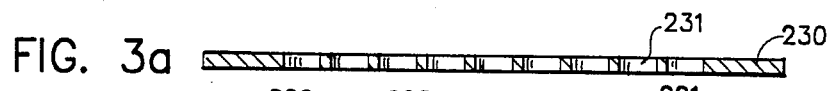
Figure 3B:
Figure 3C:
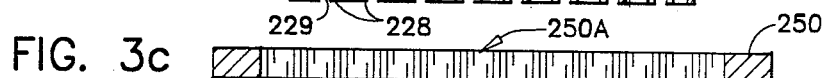
Figure 3D:
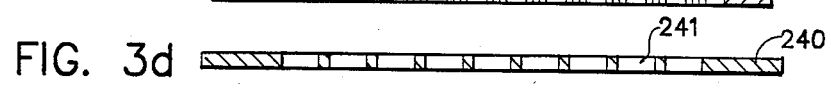

FIGS. 2, 2a, and 2b illustrate the construction of a conventional prior art carrier plate. The size of the receptor holes is exaggerated for illustrative convenience. The prior art carrier plate 110 (FIG. 2) employs a predrilled aluminum plate 111 (FIG. 2b) that defines an array of plate holes 112, and a recessed portion 113 in each face of the plate. The plate holes 112 and recessed portions 113 are filled with a suitable compliant material, an elastomeric material such as silicon rubber resin, that defines compliant material 120. After curing, smaller receptor holes 121 are drilled through the compliant material in line with the original plate holes 112 (FIGS. 2 and 2a).

In order to repair the carrier plate 110, the compliant material 120 must first be dissolved and otherwise removed. Then fresh material is added, cured, and drilled. This is time consuming and expensive, requiring special techniques and equipment.

The plate 111 is shaped and dimensioned for compatibility with other conventional end-coating equipment, such as the end-coating equipment manufactured under the brandname "Models 246 and 346 Chip Terminating Systems" by Palomar Systems & Machines, Inc. of Escondido, Calif. It is approximately 7" by 11" by 11/32" thick, and includes a U-shaped channel 114 in each end that is approximately 0.13" wide and 0.23" deep. These channels extend the full width of the plate 111, and serve to guide the carrier plate 110 along corresponding runners on the other conventional end-coating equipment with which it is used during certain steps in the end coating operation. Through-holes 115 provide means for engaging the carrier plate with a compatible hook or pin member employed in the other equipment.

Comparing this conventional prior art carrier plate 110 with the composite carrier plate 210 illustrated in FIGS. 3 and 3a–3d, further discloses novel aspects of the instant invention. The composite carrier plate 210 is illustrated partially in schematic with exaggerated hole size for convenience, and different reference numerals are employed to differentiate it from carrier plate 10, these reference numerals being increased by 200 over those designating similar elements in FIG. 1.

Thus, the carrier plate 210 includes an element 210 that is shaped and dimensioned to fit within central opening 250A of spacer 250, with these two carrier plate components being sandwiched between support plates 230 and 240 in the assembled carrier plate. Recessed portions 229 define sleeve portions 228 of the element 210 that are disposed around the receptor holes 221, and these sleeve portions extend into the plate holes 231 toward the outer support plate surface. Thus, the receptor holes 221 are accessible so that electronic components can be inserted into them, while the compliant member is sufficiently supported so that it does not flex out of shape in use.

Through-holes 215 extend through the carrier plate for engagement by a mating pin member on the other end coating equipment with which the carrier plate is used, while alignment holes 216 extend through the carrier plate to receive dowel pins (not shown) that serve to align the carrier plate components during assembly.

Figure 4:
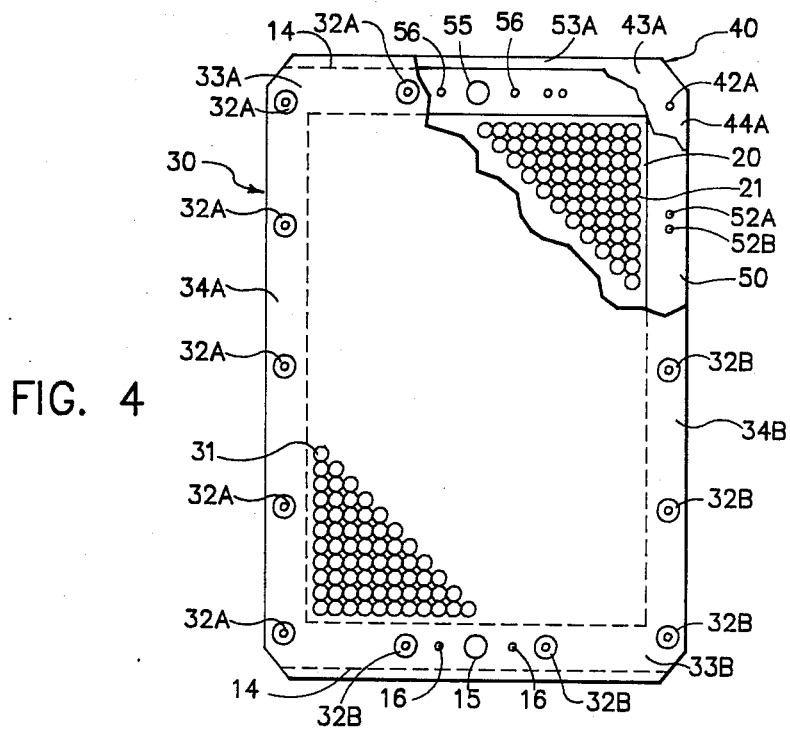
FIG. 4 is an assembled plan view of the carrier plate of FIG. 1, with portions broken out to illustrate component relative component placement.

FIG. 4 illustrates the carrier plate 10 of FIG. 1 assembled. The broken away portions in the upper righthand corner shows alignment of the carrier plate components. Thus, the element 20 fits loosely within spacer 50 to provide for element expansion when it is subjected to the elevated temperatures experienced in end coating. And these two carrier plate components are disposed between support plates 30 and 40, which are attached to the spacer 50 by suitable means such as machine screws (not shown), the spacer 50 being suitably dimensioned in thickness to retain the support plates spaced apart a fixed or specified distance to inhibit compression of the central member by the plate members.

The support plates and spacer serve as a rigid removable framework for facilitating central member handling without obstructing component access to the receptor holes. The framework can take any of various forms within the inventive concepts herein disclosed. It facilitates central member handling in the sense that it provides a rigid member that can be engaged by an otherwise mate with other component handling equipment, as well as manually by a user, while supporting the relatively flexible compliant element 20 within In this regard, facilitating central member includes supporting the central member so that it does not flex out of shape in use, that is flex or otherwise distort to the point producing misalignment, of the central member in general and the receptor holes in particular, with the other equipment. And, this arrangement enables convenient removable for replacement of the element 20.

Each of one of the two support plates is a 7" by 11" rectangularly-shaped aluminum plate having an outer surface, and inner surface (facing element 20), and an apertured portion between the support plate margins. The portion defining the array of plate holes in support plate 30 (the "apertured portion") is disposed between marginal edge portion 33A and 33B and marginal side portions 34A and 34B (FIG. 4). The apertured portion of support plate 40 is similarly disposed, and these apertured portions each define a common array of 34 holes by 56 holes for a total of 1,904 holes of 0.145" diameter that are spaced 0.180" center-to-center (plate holes 31 and 41).

The support plates are aligned with spacer 50 by placing dowel pins (not shown) through the alignment holes 16 and mating alignment holes in the spacer 50. Then, with element 20 in between the support plates, they are attached to the spacer 50 using a series of machine screws (not shown) that are placed through screw holes disposed along the periphery of the support plates. This arrangement serves to removably attach the support plates together in generally parallel, space-apart relation with the element 20 disposed in between, so that each one of the receptor holes is in line with a corresponding plate hole in each one of the support plates.

The screw holes are disposed in offset positions relative to one another so that identical support plates 30 and 40 can be employed without the screw holes of the two support plates aligning in the assembled carrier plate. This is achieved by appropriate hole placement as illustrated in FIGS. 4 and 5.

The screw holes that are indicated generally at 32 FIG. 1, include the screw holes designated 32A and 32B in FIG. 4. Similarly, the screw holes indicated generally at 42 in FIG. 1 include corresponding screw holes 42A and 42B in support plate 40, only one screw hole 42A being visible in FIG. 4. This system of designation applies also to the tapped screw holes indicated generally at 52 in FIG. 1, the tapped screw holes 52 including both the tapped screw holes 52A and 52B in FIGS. 4 and 5.

Screw holes 32A are disposed along marginal end portion 33A and marginal side portion 34A of support plate 30 to mate with the tapped screw holes 52A in the spacer 50, while screw holes 32B are disposed along marginal end portion 33B and marginal side portion 34B to mate with tapped screw holes 52B. The tapped screw holes 52A and 52B are spaced apart ¼" center-to-center, with screw holes 32A and 32B being offset relative to one another accordingly by ¼".

In addition, the position of each screw hole 32A along marginal side portion 34A is spaced from marginal edge portion 33A the same distance as the spacing from marginal edge portion 33B of a corresponding one of screw holes 32B along marginal side portion 34B. Similarly, the position of each screw hole 32A along marginal edge portion 33A is spaced from marginal edge portion 34A the same distance as the spacing from marginal side portion 34B of a corresponding one of screw holes 32B along marginal edge portion 33B. And, the corner screw holes disposed on both the marginal sides and marginal edges are located to comply with both of the preceding specifications.

The resulting hole placement is referred to herein as being "symmetrically offset," and screw holes 42A and 42B are symmetrically offset on support plate 40 in a similar manner. With this arrangement identical support plates can be used to further simplify fabrication and repair, while reducing carrier plate cost.

Further details of spacer 50 are shown in FIG. 5. Of aluminum composition, it includes marginal end portions 53A and 53B which combine with marginal side portions 54A and 54B in a symmetrical configuration that defines a central opening 50A for receiving the element 20. Through-holes 55 align with holes in the support plates to achieve the through-holes 15 described in FIG. 4, and alignment holes 56 align with alignment holes 16 to receive dowel pins for alignment purposes during carrier plate assembly. The marginal portions include a plurality of pairs of tapped screw holes, tapped screw holes 52A and 52B. The screw holes 52A are disposed to align with screw holes 32A and 42A on the support plates, while the tapped screw holes 52B are disposed to align with screw holes 32B and 42B.

Referring now to FIG. 6, there is shown an enlarged end view of a portion of the assembled carrier plate 10, with a broken out portion to illustrate screw hole alignment. Thus, screw hole 32A is countersunk beyond outer plate surface 30A, with one machine screw 60 extending through screw hole 32A into tapped screw hole 52A. Screw hole 42B is similarly countersunk beyond outer plate surface 40A, with the other machine screw 60 extending through screw hole 42B into tapped screw hole 52B. The support plates are identical, but appropriate hole placement provides a ¼" separation between the machine screw centers.

FIG. 6 also illustrates the channels 14 disposed at opposite ends of the carrier plate 10. Spacer 50 is assembled abutting inner plate surfaces 30B and 40B. Spacer 50 has a length that is slightly shorter than the length of the support plates, and this results in the channels 14 when the carrier plate components are assembled. The length of spacer 50 is chosen to achieve a desired channel depth, while the thickness of spacer 50 is chosen to retain the support plates spaced apart a specified distance and thereby achieve a desired channel width. The illustrated spacer 50 is dimensioned to result in channels 14 that mate with conventional end coating equipment of the type previously described. This, and the rectangular shape and dimensions of the support plates results in a framework that generally conforms to the shape of conventional carrier plates, such as the carrier plate 110 in FIG. 2, to enable use with conventional end coating equipment.

Considering now FIG. 7, element 20 comprises a body of material of unitary construction. It is composed of an elastomeric material such as silicon rubber resin injection molded to the desired configuration. This achieves a compliant central member that will yield slightly to electronic components forced gently into the undersized receptor holes 21.

Rectangularly shaped, element 20 includes marginal end portions 23A and 23B, and marginal side portions 24A ans 24B that surround the apertured portion 27. The apertured portion 27 defines an array of 34 holes by 56 holes for a total of 1,904 receptor holes of 0.050" diameter spaced 0.180" center-to-center (receptor holes 21) that mate with the array of plate holes 31 and plate holes 41 in the support plates. The diameter of the receptor holes 21 is chosen so that the cross sectional area of the receptor holes is slightly smaller than the electronic components to be handled with the carrier plate. Thus, a component can be force gently into each hole and retained there during the end coating operation, or other component processing operation.

Further details of the element 20 are shown in FIGS. 8–11, wherein FIG. 9 is an enlarged detail of a portion of the element 20 of FIG. 8, and FIG. 11 is and enlarged detail of a portion of the assembled carrier plate of FIG. 10. The element 20 has a first surface 25A and a second surface 26A, between which the receptor holes 21 extend. Recessed portions 29 extend to recessed surfaces 25 and 26 to define a plurality of outwardly extending cylindrical sleeve portions, sleeves 28. Each one of the sleeves 28 is disposed around one of the receptor holes 21.

The sleeves 28 are shaped and dimensioned at 28A in FIG. 8, relative to the diameter of the plate holes 31 and plate holes 41 of the support plates, so that the sleeves 28 fit loosely into the plate holes when the carrier plate is assembled. The recesses 29 cutback the element 20 to recessed surfaces 25 and 26, and the distance between these recessed surfaces is approximately equal to the thickness of spacer 50. This enables the element 20 to fit loosely between the support plates and extend into each of the plate holes so that first surface 25A and second surface 26A are disposed further toward generally coplanar alignment with outer plate surfaces.

As shown in FIG. 11, the sleeves extend into the support plates toward the outer plate surfaces 30A and 40A, and the distance between surfaces 25 and 25A and between surfaces 26 and 26A establish how far the sleeve portions 28 extend. This dimension is chosen in the illustrated carrier plate to attain generally coplanar alignment of surfaces 25A and 26A with the outer support plate surfaces (FIG. 11).

Thus, a very novel and functional composite carrier plate is achieve that overcomes many problems associated with the prior art. Though described with reference to a particular embodiment, various hole patterns and sizes are possible within the inventive concepts herein disclosed.

In addition, the framework can employ various configurations according to user specifications, while retaining the composite construction enabling replacement of the compliant central member within.

Furthermore, the invention is intended for use handling components for purposes other than end coating, such as for component testing purposes.

As various changes other may be made in the form, construction, and arrangement of the procedures and parts described herein, without departing from the spirit and scope of the invention and without sacrificing any of its advantages, all matter herein is to be interpreted as illustrative and not in any limiting sense.

What is claimed is:

1. A device for handling miniature electronic components, comprising:
    a pair of first and second generally rigid plate members, each one of the plate members having an outer plate surface, an inner plate surface, and an apertured portion defining a common array of plate holes extending through the plate member between the inner and outer surfaces;
    mounting means for removably attaching the first and second plate members together so that the inner plate surfaces are facing each other separated by a specified distance and the plate holes are aligned; and a compliant element of unitary construction and compliant composition disposed between the first and second plates for receiving and retaining a batch of components to be handled, the compliant element having a size and shape adapted to fit loosely between the inner plate surfaces and to extend into each of the plate holes toward the outer plate surfaces so that the first and second surfaces of the compliant element are disposed toward generally coplanar alignment with respective ones of the inner and outer plate surfaces; and an apertured portion of the compliant element defining an array of receptor holes extending through the element between the first and second surfaces in alignment with the plate holes, each one of the receptor holes having a cross sectional area that is shaped and dimensioned to receive in a force fit one of a batch of electronic components to be handled.

2. A device as recited in claim 1, wherein the mounting means includes:

spacing means defining a spacing member having a generally rigid, flat, open frame for mounting between the first and second plate members around the periphery of the element to retain a specified distance between the plate members.

3. A device as recited in claim 2, wherein:

the spacing member has a length slightly less than the length of the first and second plate members to define a pair of channels disposed at opposing ends of the plates members for engaging corresponding runners on specified end-coating equipment.

4. A device as recited in claim 2, further comprising:

screw hole means defining a common array of symmetrically offset screw holes in each one of the plate members and a plurality of pairs of first and second tapped screw holes in the spacing member disposed to align with the screw holes in the plate members, for enabling attachment of each one of the plate members to the spacing member using separate ones of the first and second tapped screw holes.

5. A compliant member for mounting within a carrier plate framework of the type employing a pair of first and second plate members attached together in spaced-apart relation that each have an outer plate surface, an inner plate surface, and an apertured portion defining a common array of plate holes extending through the plate member between the inner and outer surfaces, the compliant member, comprising:

a body of material of unitary construction and compliant composition defining a compliant member having a pair of generally parallel, spaced-apart, first and second exterior surfaces and a size and shape adapted to be mounted within a carrier plate framework of said type;

an apertured portion of the compliant member defining an array of receptor holes extending through the compliant member between the first and second exterior surfaces, each one of the receptor holes having a cross sectional area that is shaped and dimensioned to receive in a force fit one of a batch of electronic components of specified dimensions; and recess means defining a recessed portion in each of the first and second surfaces around each of the receptor holes for defining a plurality of outwardly-extending sleeve portions in the compliant member, each sleeve portion having a size and shape adapted to extend into one of the plate holes so that the first and second surfaces of the compliant member are disposed toward generally coplanar alignment with respective ones of the outer plate surfaces.

6. A device for handling miniature electronic componets, comprising:

a pair of first and second generally rigid plate members, each one of the plate members having an outer plate surface, an inner plate surface, and an apertured portion defining a common array of plate holes extending through the plate member between the inner and outer surface;

a body of material of unitary construction and compliant composition defining a compliant member having a pair of generally parallel, spaced-apart, first and second exterior surfaces and a size and shape adapted to be mounted between the first and second plate members;

an apertured portion of the compliant member defining an array of receptor holes extending through the compliant member between the first and second exterior surfaces, each one of the receptor holes having a cross sectional area that is shaped and dimensioned to receive in a force fit one of a batch of electronic components of specified dimensions;

recess means defining a recessed portion in each of the first and second surfaces around each of the receptor holes for defining a plurality of outwardly-extending sleeve portions in the compliant member, each sleeve portion having a size and shape adapted to extend into one of the plate holes so that the first and second surfaces of the compliant member are disposed toward generally coplanar alignment with respective ones of the outer plate surfaces; and mounting means for removably attaching the first and second plate members together in generally parallel, spaced-apart relation with the compliant member disposed in between so that the each one of the receptor holes is in line with a corresponding plate hole in each one of the plate members.

7. A device as recited in claim 6, wherein the mounting means includes:

spacing means for retaining the plate members spaced apart a specified distance to inhibit compression of the central member by the plate members, including a rigid member adapted to be mounted between the plate members.

8. A device as recited in claim 7, wherein the spacing means comprises:

a generally rigid spacing member defining a generally flat, open frame having a size and shape adapted to be mounted between the first and second plate members, to extend around the central member and retain the specified distance between the plate members.

9. A device as recited in claim 6, further comprising:

channel means defining a pair of oppositely disposed channels in the framework for engaging corresponding runners on specified end coating equipment.

10. A device as recited in claim 7, further comprising:

screw hole means defining a common array of symmetrically offset screw holes in each one of the plate members and a plurality of pairs of first and second tapped screw holes in the spacing member disposed to align with the screw holes in the plate members, for enabling attachment of each one of the plate members to the spacing member using separate ones of the first and second tapped screw holes.

* * * * *